United States Patent
Standley

(10) Patent No.: US 8,633,845 B2
(45) Date of Patent: Jan. 21, 2014

(54) LOW POWER SLOPE-BASED ANALOG-TO-DIGITAL CONVERTER

(75) Inventor: David Lawrence Standley, Westlake Village, CA (US)

(73) Assignee: Altasens, Inc., Westlake Village, CA (US)

( * ) Notice: Subject to any disclaimer, the term of this patent is extended or adjusted under 35 U.S.C. 154(b) by 33 days.

(21) Appl. No.: 13/409,380

(22) Filed: Mar. 1, 2012

(65) Prior Publication Data

US 2013/0229293 A1  Sep. 5, 2013

(51) Int. Cl.
*H03M 1/12* (2006.01)

(52) U.S. Cl.
USPC .......................................... 341/156; 341/161

(58) Field of Classification Search
USPC .......... 341/155, 144, 156, 122, 141, 161, 163
See application file for complete search history.

(56) References Cited

U.S. PATENT DOCUMENTS

| | | | |
|---|---|---|---|
| 5,117,227 A * | 5/1992 | Goeke | 341/166 |
| 5,381,054 A | 1/1995 | Standly | |
| 6,515,606 B2 * | 2/2003 | Lyden | 341/143 |
| 7,443,435 B2 | 10/2008 | Loose | |
| 7,551,114 B2 * | 6/2009 | Joy et al. | 341/161 |
| 7,616,243 B2 | 11/2009 | Kozlowski | |
| 7,750,830 B2 * | 7/2010 | Hsien et al. | 341/120 |
| 7,760,258 B2 | 7/2010 | Huang et al. | |
| 7,855,748 B2 | 12/2010 | Rossi et al. | |
| 7,930,580 B2 | 4/2011 | Marchesini et al. | |
| 7,978,115 B2 * | 7/2011 | Veeder et al. | 341/161 |
| 7,994,858 B2 | 8/2011 | Standley et al. | |

\* cited by examiner

*Primary Examiner* — Peguy Jean Pierre
(74) *Attorney, Agent, or Firm* — Turocy & Watson, LLP

(57) ABSTRACT

Providing for a two-stage single-slope analog to digital converter (ADC) exhibiting high resolution in conjunction with reduced power consumption is described herein. The ADC can achieve a digital resolution of at least 13 bits according to one or more disclosed embodiments, with significantly lower power consumption than conventional high resolution analog to digital converters. In operation, bias current supplied to one or more components of the ADC can be ramped up to a high magnitude during high accuracy or high speed processes of the ADC. Upon completion of these processes, the bias current can be sharply reduced for at least a portion of a clock cycle. During a residue amplification process associated with a second stage of the ADC, bias current can be increased to a moderate level. Average power consumption can be reduced significantly, while maintaining peak power requirements.

20 Claims, 10 Drawing Sheets

LOW POWER SLOPE-BASED ANALOG-TO-DIGITAL CONVERTER

TECHNICAL FIELD

The subject disclosure relates generally to providing digital output for analog optical information generated by an optical sensor array, and more particularly to providing a low power slope-based analog to digital converter.

BACKGROUND

Electronic cameras, video cameras, and related image capture devices have become very popular in recent years. This is at least in part due to the rapid advancements in electronic technology, reducing the cost of these devices and greatly enhancing their technical features. The combination of drastically reduced cost and greatly increased utility has driven consumer demand to unparalleled levels, making these devices very common among the general consumer population.

Traditionally, video capture devices were much more sophisticated and expensive than image capture devices, and electronic equipment needed to capture video was much more expensive than equipment for capturing still frames. This is in part because video generally requires 60 or more images per second, and traditional electronics capable of capturing and processing images this quickly were large and expensive. However, as high speed image processing electronics have become smaller, less expensive and easier to manufacture, both cameras and video cameras commonly include both image capture and video capture capabilities, lessening the practical and technological distinctions between these devices.

High speed image processing involves faster hardware, including processors and memory, as well as higher clock speeds. These requirements extend to the image sensor, which captures and outputs image information at a rate at least equal to the video frame rate, as well as the image processing electronics, which converts the output image information into a usable form for graphical display at similar rates. A general rule in electronics is that faster signal processing, particularly analog signal processing, consumes more electronic power. In addition, as image capture devices transition to high definition imaging, the graphical resolutions increase greatly. Increased resolution involves the capture and processing of more information than low resolution systems, further increasing power consumption. In some cases, digital electronics can both reduce power consumption and increase processing speeds, providing advantages over analog devices.

State of the art digital cameras still comprise analog equipment. For instance, an image sensor comprises a photodetector array that captures optical information at a given resolution, and outputs electronic information in analog form. In a column-parallel sensor, analog electronic signals are generally aggregated for each column and output to an analog to digital converter (ADC), also referred to as a column-parallel ADC. Several types of column-parallel ADCs exist, such as the slope-based ADC used in many modern state of the art image sensors. The column-parallel slope-based ADC provides desirable features, including compact implementation in the image sensor column.

One of the simpler and more common slope-based ADCs is referred to as a one-step single-slope (SS) ADC. The SS ADC utilizes a comparator and digital counter in each column of a photodetector array. The primary drawback is difficulty in scaling up to higher resolutions. This translates to a corresponding increase in conversion time or required clocking frequency for the ADC. However, as demand for higher resolutions continues with high definition video, further research and development in image processing electronics will be required. Higher resolutions, coupled with higher clock frequencies and lower power consumption are still being sought to meet the high definition requirements in modern electronics.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In various aspects of the subject disclosure, provided is an analog to digital converter (ADC) exhibiting high resolution in conjunction with reduced power consumption. In some aspects, the ADC can comprise a two-stage ADC. The two-stage ADC can achieve a digital resolution of 10 or more bits in particular aspects. In at least one such aspect, the two-stage ADC can achieve a digital resolution of 13 bits. In a further aspect, average power consumption of the two-stage ADC can be reduced by lowering bias current supplied to the two-stage ADC during at least a portion of a clock cycle.

According to other aspects, disclosed is a two-stage ADC having a first stage and a second stage. The first stage receives an analog input and generates a set of most significant bits for a digital output. A residue of the input signal and a reference voltage is utilized by the second stage to extract a set of least significant bits for the digital output. The combined least significant bits and most significant bits result in a high resolution digital output. In particular aspects, power consumption of the two-stage ADC is reduced by lowering a bias current supplied to the first stage after generation of the set of most significant bits. Peak bias current is maintained during the generation of the most significant bits, yielding high accuracy for high clock speeds, while lower bias current is provided where high accuracy or high clock speeds are less important.

In still other aspects, provided is a two-stage ADC comprising a bump bias generator. The bump bias generator produces a bias current to the two-stage ADC derived from an analog input voltage, and a reference voltage. The bias current is produced so as to ramp up to a maximum magnitude during a first segment of a clock cycle, quickly fall off and remain at a low magnitude during a second segment of the clock cycle, and ramp up to a moderate magnitude, greater than the low magnitude and less than the maximum magnitude, during a third segment of the clock cycle. Further, the two-stage ADC is configured to generate a set of most significant bits of a digital output and track the reference voltage during the first segment, hold the reference voltage during the second segment, and amplify a residue of the analog input and reference voltage and derive a set of least significant bits from the amplified residue during the third segment.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advan-

DETAILED DESCRIPTION

Figure 1:
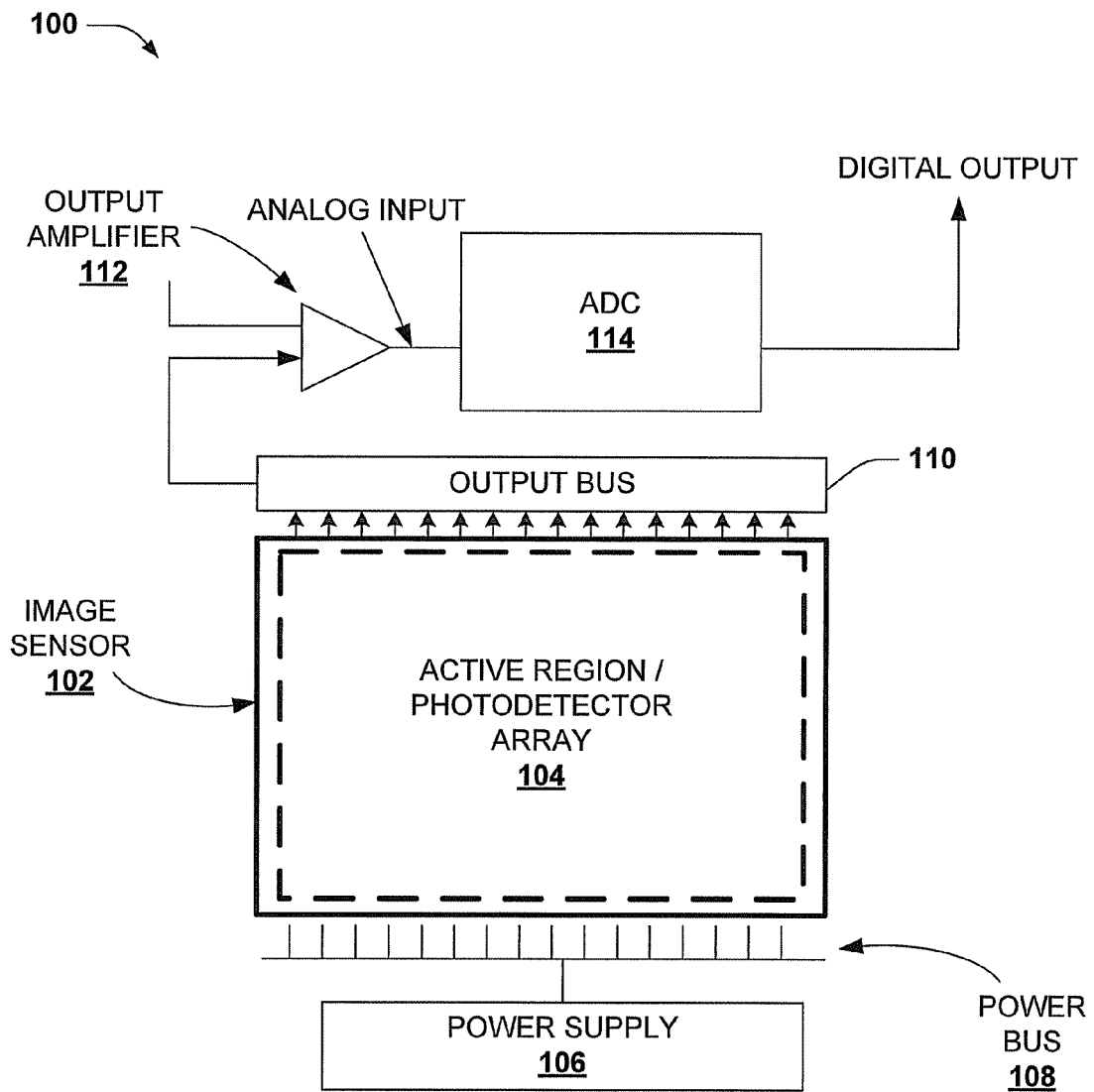
FIG. 1 illustrates a block diagram of an example opto-electronic imaging system according to various aspects of the subject disclosure.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

As utilized herein, terms "component," "system," and the like are intended to refer to an electronic or computing entity, either hardware, software (e.g., in execution), or firmware. For example, a component can be one or more semiconductor transistors, an arrangement of semiconductor transistors, a circuit, data transfer or integration circuitry, an electronic clock, a process running on a processor, a processor, an object, a state machine, a computer, etc. By way of illustration, a circuit, a transistor array electrically connected with the circuit, or a controller that manages data flow between the transistor array and the circuit can be a component. Furthermore, an apparatus can comprise one or more components that operate together as a system. For instance, the apparatus can comprise an arrangement of electronic hardware, data transfer circuits, logical control circuits, memory circuits that store processing instructions, and a processing circuit that implements the processing instructions in a manner suitable to perform an electronic or computing task.

Furthermore, various aspects of the disclosed subject matter can be implemented as a method, apparatus, or article of manufacture using typical manufacturing, programming or engineering techniques to produce hardware, firmware, software, or any suitable combination thereof to control an electronic device to implement one or more of the disclosed aspects. The term "article of manufacture" as used herein is intended to encompass an electronic device, a semiconductor device, a computer, or a computer program accessible from any computer-readable device, carrier, or media. By way of example, and not limitation, computer-readable media can include hardware media, or software media. In addition, the media can include storage media, transport media or communication media. For example, computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include a data transfer bus, a signal interface (e.g., a wireless communication interface), or the like. Of course, those skilled in the art will recognize many modifications can be made to this configuration without departing from the scope or spirit of the disclosed subject matter.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

Various aspects of the subject disclosure provide for low power, high resolution analog to digital conversion. In particular aspects, the analog to digital conversion can be utilized in conjunction with an optical sensor array and digital electronic camera, although the scope of the subject disclosure is not limited to these aspects.

As demand for high definition video increases, electronic circuitry capable of processing higher digital resolutions are also required. Generally, high resolution video involves processing much higher quantities of data as compared with lower resolution video. Processing more information while maintaining overall frame rates typically involves higher clock speeds, and higher power consumption. In many practical applications, power consumption associated with high speed, high resolution video processing can become prohibitive, reducing circuit life, increasing heat output, or significantly increasing component cost to address these problems, as well as other problems.

A slope-based analog to digital converter (ADC) is often utilized in conjunction with complementary metal oxide semiconductor (CMOS) image sensing devices. Compared with other ADC types, the slope-based architecture offers compact implementation. But as demand for higher resolution has increased, the drawback of the slope-based approach—need for very fast clock relative to conversion speed—has become exacerbated. Certain enhancements, such as dual slope and two-stage designs can alleviate this drawback in many circumstances.

A dual-slope design reduces conversion time by reducing the resolution at a brighter region of a transfer curve by using a steeper slope. This lessens requirements on clock speed and its associated comparator. A two-stage ADC is similar to sub-ranging designs. As an example, the two-step design can be implemented to convert a set of coarse bits first (e.g., most significant bits), and then converts a set of fine bits (e.g., least significant bits) based on a residue signal. Thus, for instance, the two-stage ADC receives an analog signal as an input, and a first stage of the two-stage ADC generates the coarse bits while the second stage extracts the set of fine bits. By combining the coarse and fine sets of bits, the digital output is produced and output by the two-stage ADC. Generally, several level-shifted simultaneous slopes (or a precise slope) are employed in conjunction with the two-stage ADC. This can increase power consumption requirements in the ADC.

For high resolution, a two-stage ADC is provided in conjunction with a single slope. A first stage can comprise a track and hold (T/H) and residue amplifier that amplifies a residue between the analog input and a reference signal. The amplified residue can be stored for the second stage. The second stage samples the amplified residue to extract a set of least significant bits (LSBs), which can be combined with the set of most significant bits to generate the digital output. As resolution increases (e.g., 10 or more bits), the T/H and residue amplifier consumes increasing amounts of power to keep noise minimal. This is in addition to the power consumed by resolving the analog signal to a least significant bit at a second stage comparator. Combined with settling time constraints, this can result in an operational transconductance amplifier (OTA) that is small-signal limited, rather than slew-rate limited.

To address the foregoing problems, aspects of the subject disclosure decrease power to the two-stage ADC when high current is not required. For instance, high performance of the OTA is important for some analog to digital conversion processes, but less important for others. Outside of these processes, OTA current bias can be lowered significantly while maintaining a target slew rate for general functionality, for instance, during a track and hold process of the T/H and residue amplifier. A bump bias generator therefore can significantly cut average power, while providing high peak power. In some aspects, similar bias current can be provided to the comparator as well, increasing current when an analog signal is close to a reference signal, and decreasing such current otherwise.

FIG. 1 illustrates a block diagram of an example system 100 pursuant to one or more aspects of the subject disclosure. System 100 can provide reduced power consumption for output signal processing for an optical image sensor. Particularly, the reduced power consumption can be associated with converting analog optical information output by the optical image sensor, into digital information utilized for storing or display of the optical information.

As depicted, system 100 can include an image sensor 102 having an active region comprising a photodetector array 104. Photodetector array 104 comprises a two-dimensional set of opto-electronic sensors configured to receive (e.g., absorb) electromagnetic energy and generate a current or voltage as an output. Photodetector array 104 can comprise color opto-electronic sensors (e.g., red sensors, green sensors, blue sensors, ... ), or grayscale opto-electronic sensors, in various embodiments. In at least one aspect, photodetector array 104 can comprise a column-parallel array of opto-electronic sensors.

Image sensor 102 and active region/photodetector array 104 receive electrical power from a power supply 106, via a power bus 108. A clock(s) (not depicted) can generate one or more clock signal for controlling timing of electric power, transfer of electronic signals among components of system 100, signal processing operations of various electronic components, and the like.

Electronic signals generated by active region/photodetector array 104 comprise optical information captured by the opto-electronic sensors, and are provided in analog form at an output bus 110, and to an output amplifier 112. Output amplifier 112 can increase or decrease a magnitude of the electronic signals, according to electronic configurations of output amplifier 112. A modified analog signal is output by output amplifier and provided as an input analog optical information signal to an analog to digital converter (ADC) 114.

According to various aspects of the subject disclosure, ADC 114 can be a high resolution signal converter, as compared with conventional signal converters employed in conjunction with an image sensor. For instance, ADC 114 can have a resolution of 10 or more bits, in some disclosed aspects, providing a 10 or more bit digital output. In at least one aspect, ADC 114 can have a resolution of at least 13 bits, in which case the digital output is at least 13 bits.

In other aspects, ADC 114 can comprise a two-stage single slope (SS) signal converter. In at least one example, ADC 114 can be a column-parallel two-stage SS ADC. Furthermore, it should be appreciated that ADC 114 can be operated at low average power consumption in various aspects of the subject disclosure, reducing stress associated with high resolution digital output operating at frequencies suitable for video output (e.g., high resolution, or high definition video output). Various suitable embodiments of ADC 114 are described in more detail throughout this disclosure.

Figure 2:
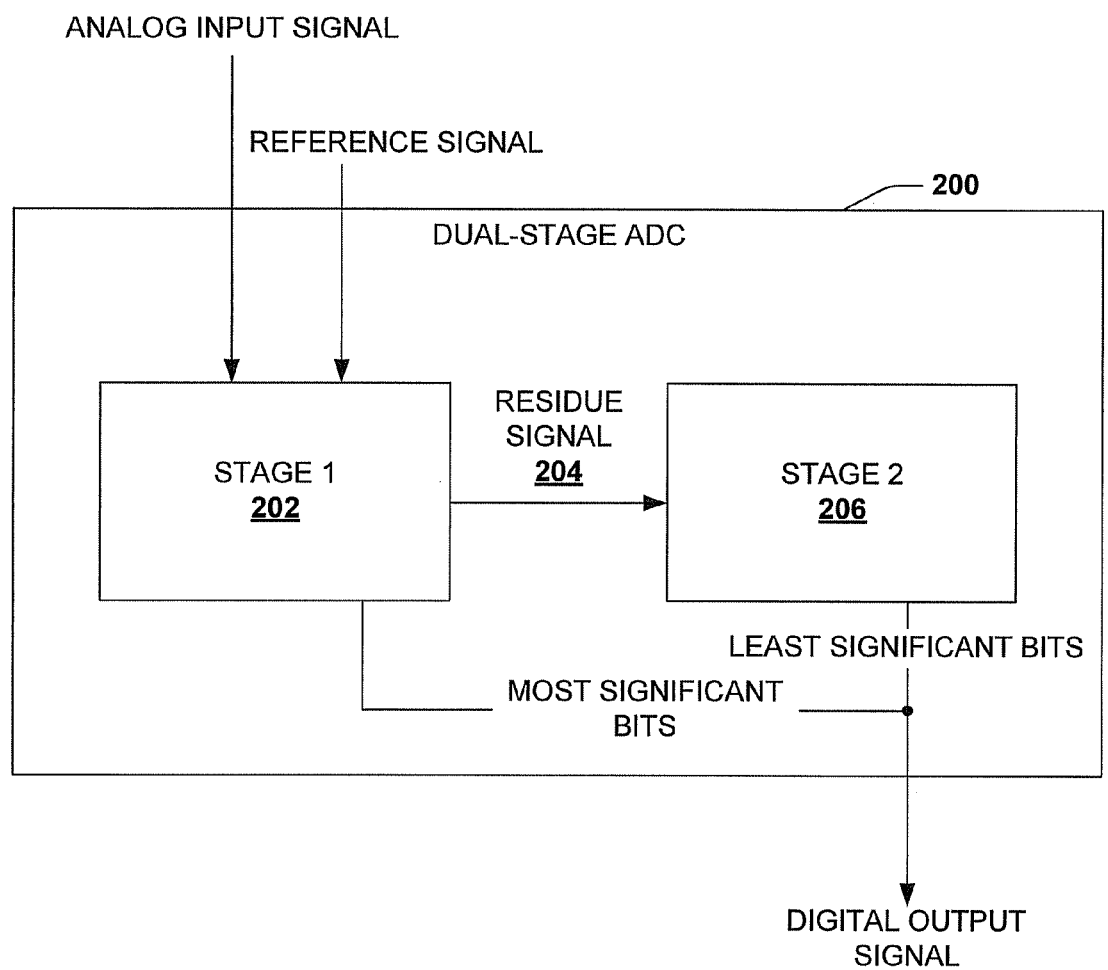
FIG. 2 depicts a block diagram of an example two-stage analog to digital (ADC) converter for digital image acquisition according to an aspect(s).

FIG. 2 illustrates a block diagram of an example dual-stage ADC 200 according to one or more disclosed aspects. ADC 200 can be operated in conjunction with an image sensor, to convert analog optical information (e.g., an image, a video, ... ) output by the image sensor into digital optical information. In digital form, the optical information can inexpensively and easily be stored, displayed on a graphical display, transmitted over a communication network, and so on. In at least one aspect, dual-stage ADC 200 can be substantially similar to ADC 114 of FIG. 1, supra; however, the subject disclosure is not limited to this aspect(s).

Dual-stage ADC 200 can comprise a first stage circuit (stage 1) 202 configured to generate a first set of digital information from an analog input signal. This first set of digital information can be utilized to form part of a digital output signal. In addition, dual-stage ADC 200 can comprise a second stage circuit (stage 2) 206 configured to generate a second set of digital information from a residue signal 204 derived from the analog input signal. By combining the first set of digital information with the second set of digital information, the analog input signal is converted to a digital output signal.

The first stage circuit 202 and second stage circuit 206 can be configured to facilitate high resolution analog to digital conversion, where one subset of the digital signal is generated at first stage circuit 202 and another subset of the digital signal is generated at second stage circuit 206. First stage circuit 202 receives the analog input signal and employs a comparator and counter to generate the first subset of the digital signal (e.g., see FIG. 3, infra). In addition, first stage circuit 202 can track and store a voltage of the reference signal, and generate a residue signal 204 from the analog input signal and the reference signal. Residue signal 204 and the stored reference voltage are provided to the second stage circuit 206.

Second stage circuit receives the residue signal 204 and reference voltage. A comparator (not depicted) can be employed to extract a second subset of the digital signal from the residue signal 204. This second subset is output by second stage circuit 204. Dual-stage ADC 200 can combine the first subset of the digital signal with the second subset of the digital signal to provide a digital output, which is a digital version of the analog input signal.

According to particular aspects, dual-stage ADC 200 can be operated in a manner that significantly reduces average power consumption, without sacrificing clock speed or system resolution. Reduction in average power consumption can be facilitated by reducing current supplied to first stage circuit 202 or to second stage circuit 206 during non-critical portions of a clock cycle. For instance, when a high accuracy operation, such as a comparison between the analog input and reference voltage is performed, a high current can be supplied to the dual-stage ADC 200. For other circuit operations, a lower current can be supplied instead, lowering average power consumption.

Figure 3:
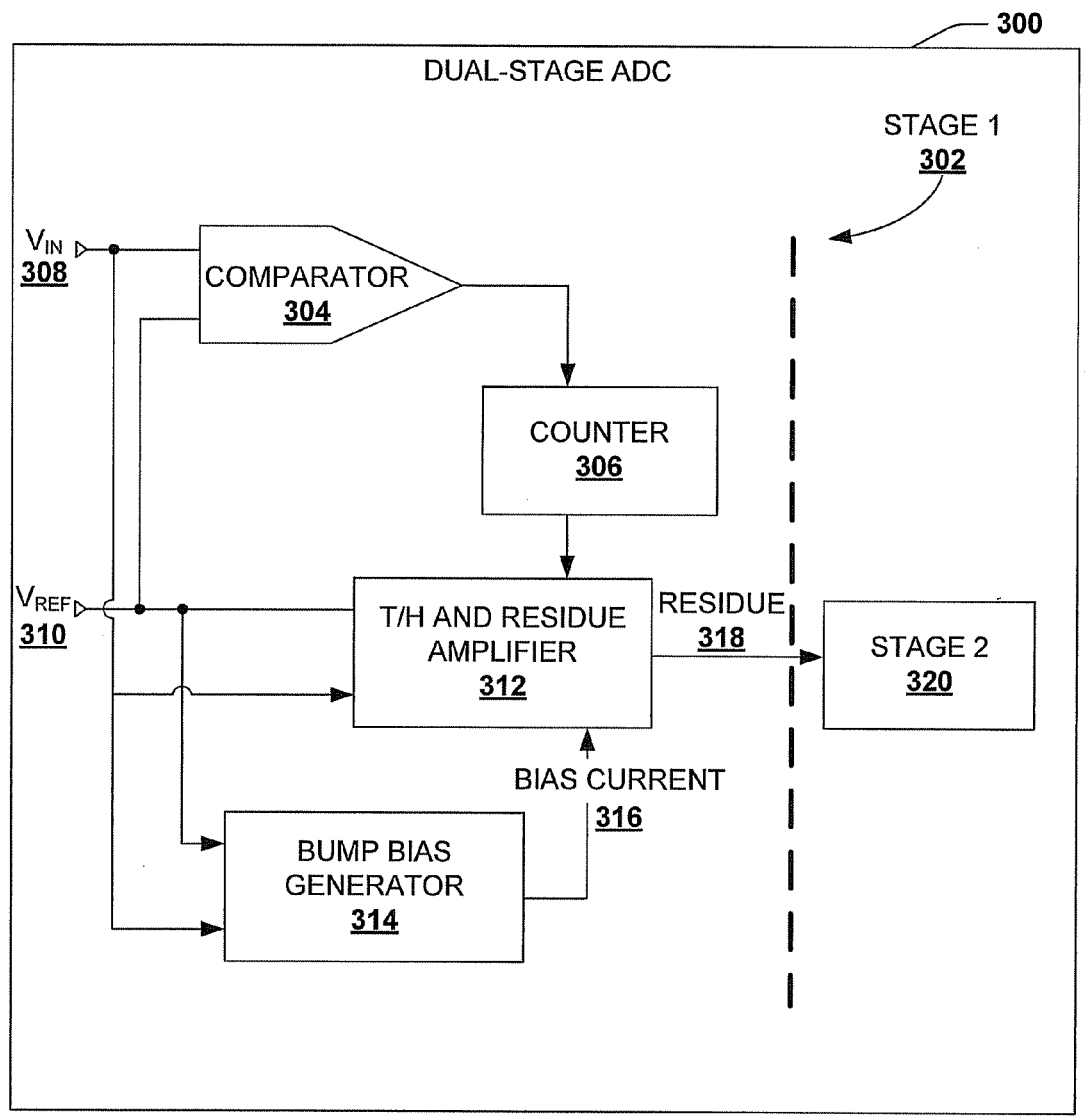
FIG. 3 illustrates a block diagram of an example circuit diagram for the ADC of FIG. 2, in one or more particular aspects.

FIG. 3 illustrates a block diagram of a circuit representation of a dual-stage ADC 300 according to still other aspects of the subject disclosure. Dual-stage ADC 300 can be substantially similar to dual-stage ADC 200, or to ADC 114 in some aspects of the present disclosure. However, the scope of the disclosure is not limited by these aspects. For instance, dual-stage ADC 300 can be utilized in conjunction with a signal source other than an image sensor, in one or more aspects.

Dual-stage ADC 300 can comprise a first stage 302 and a second stage 320. An input voltage, $V_{IN}$ 308, is an input signal provided to first stage 302, and a reference voltage, $V_{REF}$ 310, can be generated by dual-stage ADC 300, or input thereto. Comparator 304 can be configured to receive $V_{IN}$ 308 and $V_{REF}$ 310 as inputs, and generate a trigger when respective magnitudes of $V_{IN}$ 308 and $V_{REF}$ 310 are equal, or equal within a suitable threshold level. For instance, the trigger can be generated when the respective magnitudes are within a certain percentage (e.g., 1%, 2%, . . . ), within a voltage threshold (e.g., one or more millivolts, several millivolts, . . . ), within an accuracy of comparator 304, or a suitable combination thereof.

When the trigger is generated by comparator 304, counter 306 is stopped (or started), and generates a set of most significant bits (e.g., coarse bits) for a digital output associated with the analog input. Additionally, first stage 302 can comprise a track and hold (T/H) and residue amplifier 312. T/H and residue amplifier 312 provides a residue signal 318 and a reference voltage for a second stage 320 of dual-stage ADC 300. Second stage 320 can then extract a set of least significant bits for the digital output from the residue signal 318 and reference voltage.

T/H and residue amplifier 312 receives $V_{IN}$ 308 and $V_{REF}$ 310 as inputs. T/H and residue amplifier 312 tracks a voltage value of $V_{REF}$ 310, and can store that value for output to second stage 320. In addition, T/H and residue amplifier 312 receives a signal from counter 306 in response to the trigger generated by comparator 304. T/H and residue amplifier 312 derives a residue (e.g., a difference in magnitude) of $V_{IN}$ 308 and $V_{REF}$ 310, for example, in response to the signal from counter 306. The residue can then be amplified during an amplification process by T/H and residue amplifier 312, to generate a residue signal 318 as a derivative of $V_{IN}$ 308 and $V_{REF}$ 310. In one aspect of the subject disclosure, second stage 320 receives residue signal 318 and the reference voltage value stored by T/H and residue amplifier 312, and extracts a set of least significant bits for the digital output from residue signal 318 and the reference voltage. In another aspect, second stage 320 can comprise a further T/H circuit (separate from the T/H circuit included within T/H and residue amplifier 312) that tracks and stores the voltage value of residue 318 for subsequent extraction of a set of least significant bits of the digital output. Having the further T/H within second stage 320 can relax conversion time requirements, facilitating a single slope implementation of the ADC.

Figure 4:
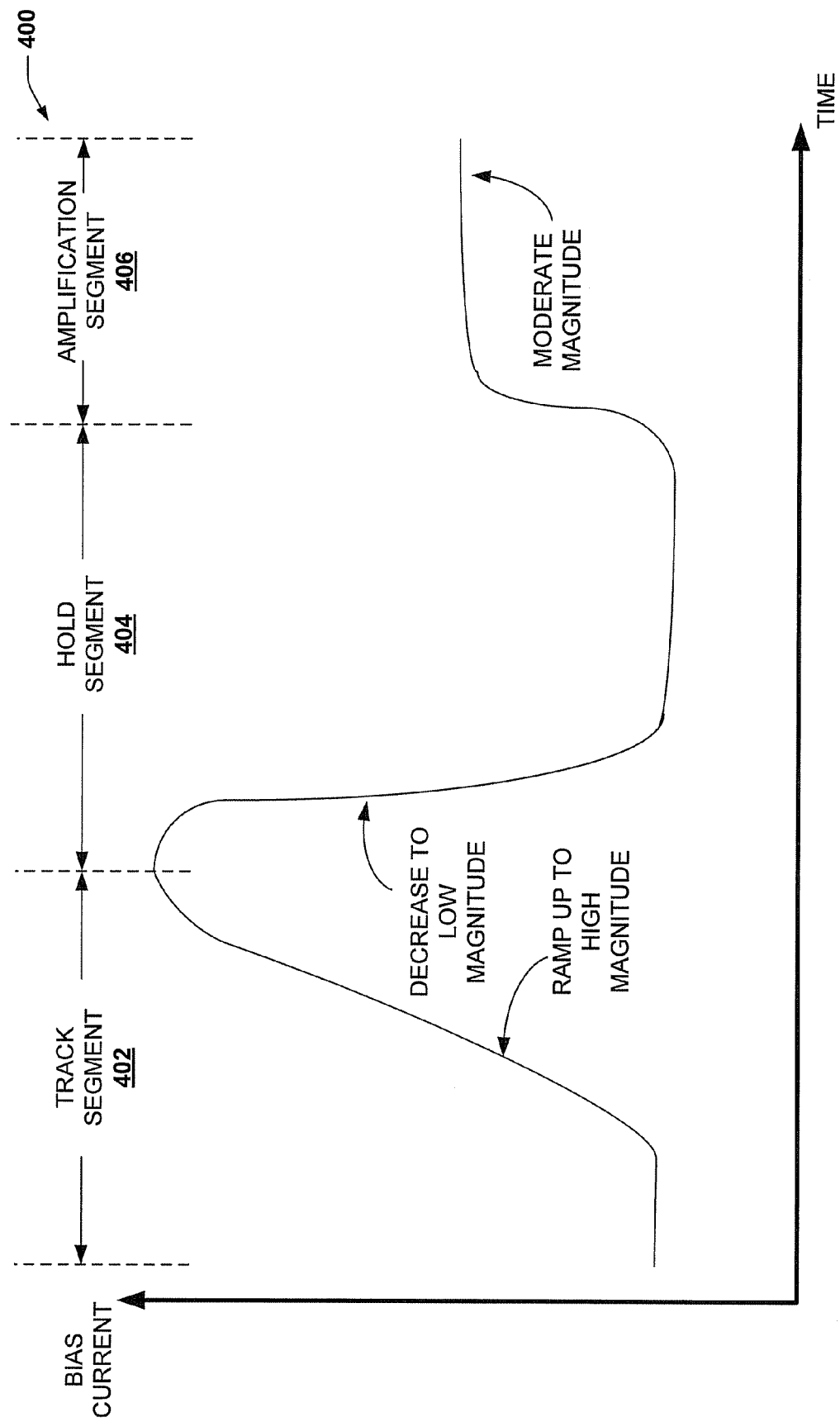
FIG. 4 depicts a diagram of an example bias current suitable for reducing average power consumption of a two-stage ADC in further aspects.

To reduce power consumption of first stage 302, a bump bias generator 314 can generate a non-uniform bias current 316 to power first stage 302 (e.g., see FIG. 4, infra). Bias current 316 can be increased for important or high accuracy processes of first stage 302, and can be decreased for less important or lower accuracy processes. For instance, function of determining equality between $V_{IN}$ 308 and $V_{REF}$ 310 can have higher accuracy requirements, consuming higher current. Thus, bias current 316 can be ramped up to a highest magnitude during a first segment of a clock cycle, in which comparator 304 monitors magnitudes of $V_{IN}$ 308 and $V_{REF}$ 310 and determines when respective magnitudes of the signals are equal or near equal. During a second segment of the clock cycle, after the equality determination, bias current 316 can be trimmed significantly to a low magnitude, for instance when T/H and residue amplifier 312 samples and stores a voltage value of $V_{REF}$ 310. In at least one aspect of the subject disclosure, bias current 316 can be ramped up for a third segment of the clock cycle to a moderate magnitude, greater than the low magnitude and less than the highest magnitude, for amplification of the residue by T/H and residue amplifier 312.

The non-uniform bias current 316 can facilitate meeting performance requirements of dual-stage ADC 300, while reducing overall power consumption. This can be accomplished by providing peak current levels that meet peak power requirements, and ramping down the current level when less than peak power is adequate. The bump bias generator 314 can be implemented with a very simple and low power circuit, such as that described by Delbruck et al. in U.S. Pat. No. 5,099,156 (incorporated by reference herein in its entirety). The bump bias generator need not provide high accuracy to achieve significant power saving benefits. (The bias during the third period—e.g., amplification segment 406 of FIG. 4, infra—can be generated by using the timing to switch to a separate source.) Indeed, the power saving benefits can be far more substantial than techniques that shut down the comparator after toggling, or that stop and start the counter.

FIG. 4 illustrates a diagram of an example bias current 400 that can be utilized in conjunction with reducing average power in analog to digital conversion as described herein. Bias current 400 can be generated by a bump bias generator, as depicted at FIG. 3, supra. Current magnitude is depicted on the vertical axis, with time depicted on the horizontal axis. Bias current 400 is described with three basic segments of a clock cycle. The first segment is a track segment 402, where bias current 400 is ramped up to a high magnitude. Track segment 402 can correspond with a process in which a comparator measures the difference between two or more signals (e.g., an analog input and a reference voltage). At the end of track segment 402, bias current 400 can reach its peak or approximately its peak magnitude. A hold segment 404 begins following the signal comparison segment 402, in which bias current 400 drops off rapidly in magnitude to a low magnitude current level. Hold segment 404 can correspond to a reference voltage level being stored in a sampling capacitor (e.g., see FIG. 6, infra). During hold segment 404, current level remains at the low magnitude. Upon completion of hold segment 404, an amplification segment 406 begins. Amplification segment 406 can correspond with amplification of a residue voltage by a T/H and residue amplification circuit (e.g., T/H and residue amplification 312 of FIG. 3, supra).

During amplification segment 406, bias current 400 is increased to a moderate magnitude that is greater than the low magnitude of hold segment 404, yet smaller than the peak magnitude of track segment 402. Upon completion of amplification segment 406, bias current 400 can again return to the low magnitude at the beginning of the next clock cycle. As can be readily observed from FIG. 4, average circuit power consumption associated with bias current 400 can be significantly reduced as compared to a bias current that remains at the peak magnitude for the entire clock cycle.

Figure 5:
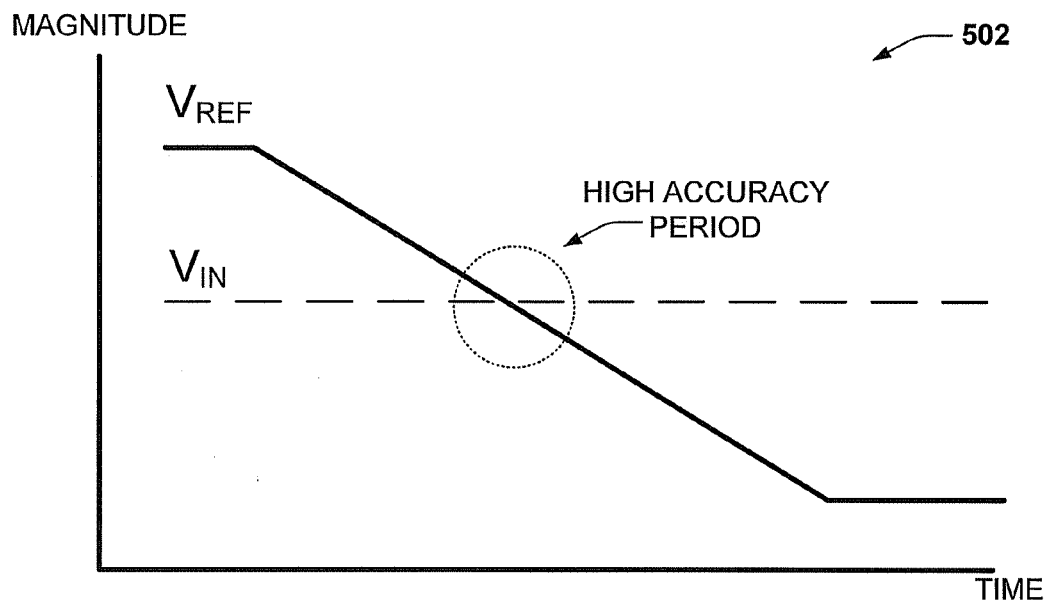
FIG. 5 depicts diagrams of example reference voltages that can be utilized in conjunction with a two-stage ADC disclosed herein.
Figure 5:
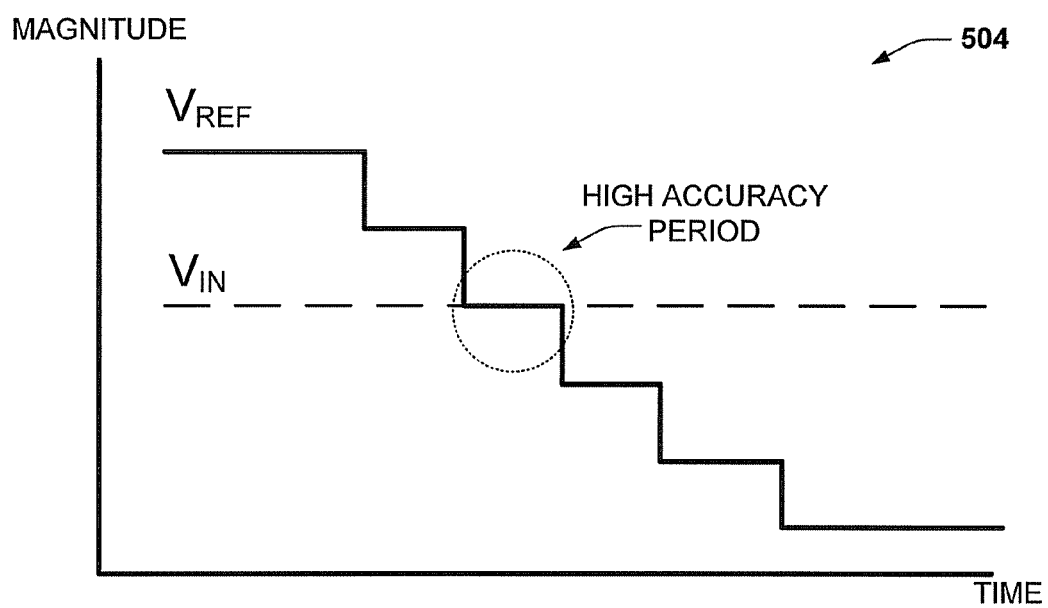

FIG. 5 illustrates diagrams of respective clock cycles 502, 504 having reference voltage signals that can be employed in conjunction with various aspects of the subject disclosure. Clock cycle 502 depicts a reference voltage, $V_{REF}$ relative to an input signal, $V_{IN}$. A high accuracy period represents a portion of clock cycle 502 in which $V_{REF}$ and $V_{IN}$ are relatively close in magnitude. This high accuracy period can correspond with track segment 402 of FIG. 4, supra. Clock cycle 504 depicts an alternate reference voltage, where $V_{REF}$ is a step signal having several discrete magnitudes of different values. As depicted, clock cycle 504 can also comprise a high accuracy period, in which $V_{REF}$ and $V_{IN}$ are nearly the same (e.g., of equal magnitude within a threshold level, or within an accuracy rating of a comparator determining the respective magnitudes). The ramp down reference voltage of clock cycle 502 or the step down reference voltage of clock cycle 504 can be utilized in conjunction with an ADC as described herein, including ADC 114 of FIG. 1, dual-stage ADC 200 of FIG. 2, or dual-stage ADC 300 of FIG. 3, supra, or in conjunction with T/H and residue amplification circuit 600 of FIG. 6, infra.

Figure 6:
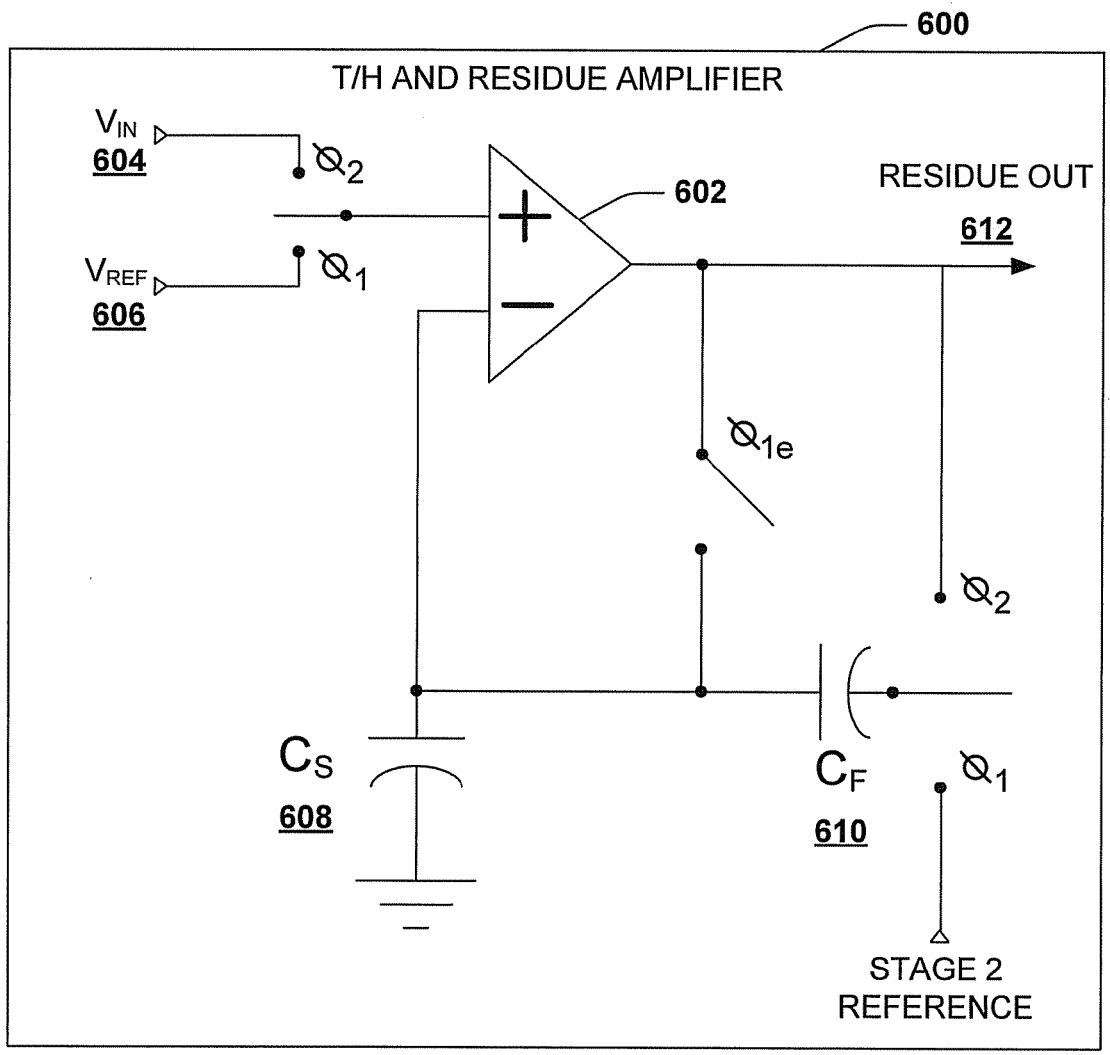
FIG. 6 depicts a block diagram of an example track and hold and residue amplification circuit for use with a two-stage ADC disclosed herein.
Figure 6:
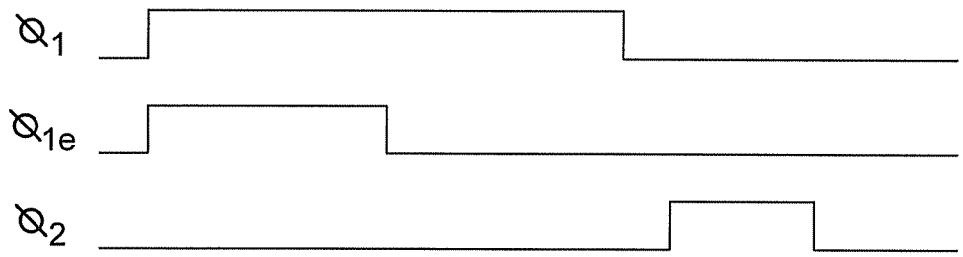

FIG. 6 illustrates a circuit diagram of a T/H and residue amplifier 600 according to aspects of the subject disclosure. T/H and residue amplifier 600 can be substantially similar to T/H and residue amplifier 312 in at least one aspect of the subject disclosure, although the disclosure is not limited to this aspect(s). T/H and residue amplifier 600 comprises an operational transconductance amplifier (OTA) 602 having a first input (+ input) and a second input (− input). The first input comprises a switch that can be connected alternately to an analog input signal $V_{IN}$ 604 and a second clock signal ($\phi_2$) or to a reference signal $V_{REF}$ 606 and a first clock signal ($\phi_1$). The first and second clock signals are indicated below T/H and residue amplifier 600. At the beginning of a clock pulse, a first clock segment begins and the first input of OTA 602 is connected to $V_{REF}$ 606 and the first clock signal. A sampling capacitor 608 tracks and stores the voltage of $V_{REF}$ 606. At the end of the first clock segment, a switch connected to the output of OTA 602 turns off as a third clock signal ($\phi_{1e}$) goes low, which can correspond with or be triggered by a signal from counter 306 of FIG. 3, supra. Additionally, a second capacitor $C_F$ 610 is connected to a stage 2 reference and stores a voltage of the stage 2 reference. At an end of the second clock segment, the first clock signal goes low, and the second clock signal goes high, causing the switch at the first input of OTA 602 to be connected to $V_{IN}$ 604. This inputs $V_{IN}$ 604 at the first input of OTA 602, and the reference voltage stored at sampling capacitor 608 is input at the second input of OTA 602. Also, the output of OTA 602 is connected to the terminal of $C_F$ 610 that had previously been connected to the stage 2 reference. A difference of $V_{IN}$ 604 and the reference voltage is amplified and output from OTA 602 as a residue out signal 612, in conjunction with the stage 2 reference provided at second capacitor $C_F$ 610. The residue output signal 612 can be provided to another circuit component, such as stage 2 320 of two-stage ADC 300.

The aforementioned diagrams have been described with respect to interaction between several systems, apparatuses, components, electronic circuits, or photodetector arrays. It should be appreciated that such diagrams can include those components or systems specified therein, some of the specified components, or additional components. For example, a system could include dual-stage ADC 200, stage 1 302 comprising T/H and residue amplifier 600, and stage 2 320. Sub-components could also be implemented as architectures electrically connected to other sub-components rather than included within a parent architecture. Additionally, it should be noted that two or more components could be combined into a single component providing aggregate functionality. For instance, comparator 304 can include counter 306 to facilitate comparing an input and reference voltage and generating a set of most significant bits from the input, by way of a single component. Components of the disclosed systems and apparatuses can also interact with one or more other components not specifically described herein but known by those of skill in the art, or made known to one of skill in the art by way of the context provided herein.

Figure 7:
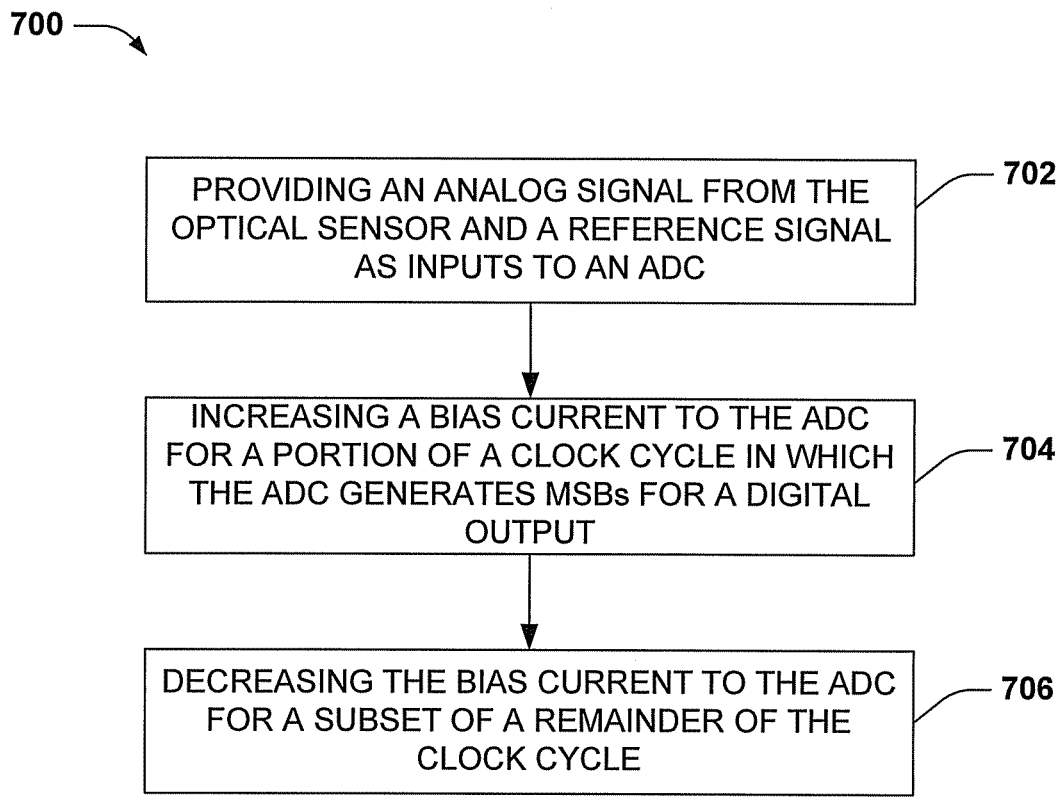
FIG. 7 illustrates a flowchart of a sample method for operating a two-stage ADC at reduced power consumption according to additional aspects.
Figure 8:
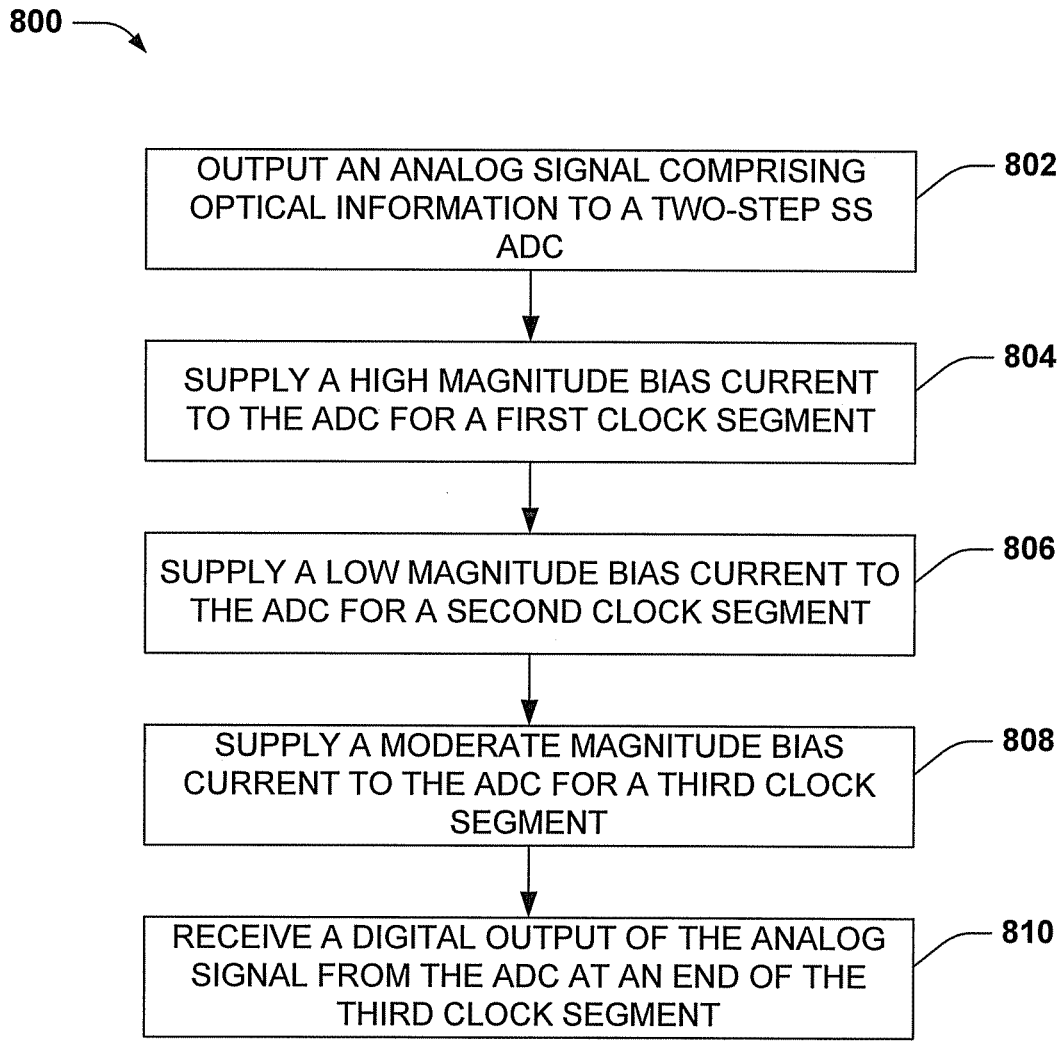
FIG. 8 depicts a flowchart of a sample method for operating a two-stage ADC according to still other aspects.
Figure 9:
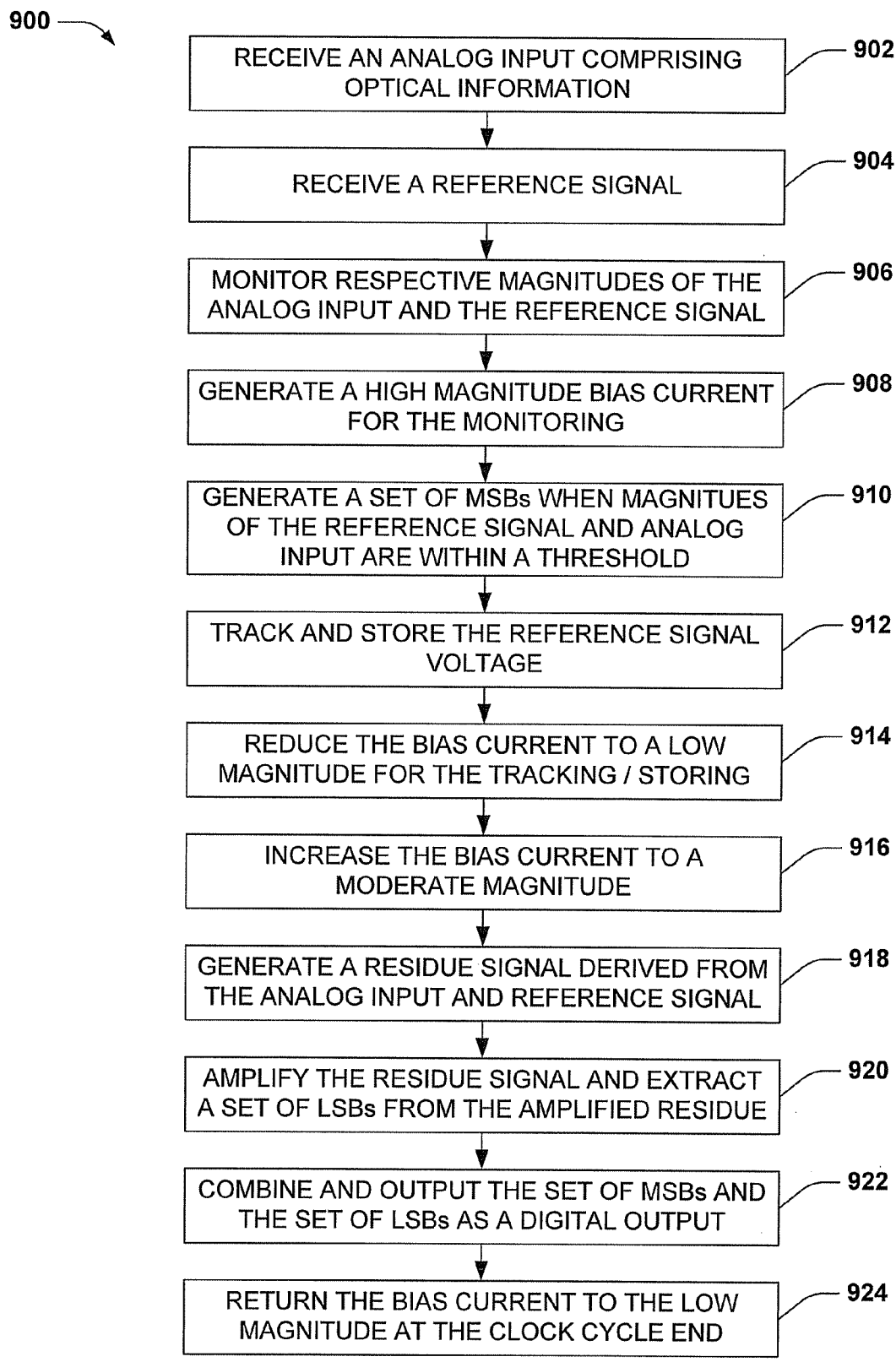
FIG. 9 depicts a flowchart of an example method for reducing power consumption in analog to digital conversion, according to an aspect.

In view of the exemplary diagrams described supra, process methods that may be implemented in accordance with the disclosed subject matter will be better appreciated with reference to the flow charts of FIGS. 7-9. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter. Additionally, it should be further appreciated that the methods disclosed hereinafter and throughout this specification are capable of being stored on an article of manufacture to facilitate transporting and transferring such methods to an electronic device. The term article of manufacture, as used, is intended to encompass a computer program accessible from any computer-readable device, device in conjunction with a carrier, or storage medium.

FIG. 7 illustrates a flowchart of an example method 700 for operating a column-parallel slope-based ADC according to particular aspects of the subject disclosure. In a particular example, the ADC can be operated according to method 700 in conjunction with digitizing analog optical information output by an optical sensor (e.g., image sensor 102). At 702, method 700 can comprise providing an analog signal from the optical sensor and a reference signal as inputs to the ADC. At 704, method 700 can comprise increasing a bias current to the ADC for a portion of a clock cycle in which respective magnitudes of the analog input and the reference signal are within a predetermined range of equality, and in which the ADC generates a set of most significant bits of a digital output signal. At 706, method 700 can comprise decreasing the bias current to the ADC following the portion of the clock cycle at least for a subset of a remainder of the clock cycle. By lowering the bias current following generation of the most significant bits, average power consumption of the ADC can be significantly reduced as compared with operating the ADC at the increased bias current for the entire clock cycle.

FIG. 8 illustrates a flowchart of a sample method 800 according to still other aspects of the subject disclosure. At 802, method 800 can comprise outputting an analog signal comprising optical information to a two-stage single slope ADC. At 804, method 800 can comprise supplying a high magnitude bias current to the ADC for a first clock segment. The first clock segment can correspond with a process that consumes high current at the ADC. At 806, method 800 can comprise supplying a low magnitude bias current to the ADC for a second clock segment. In at least one aspect, the second clock segment can correspond with a track and hold process of the ADC. Additionally, at 808, method 800 can comprise supplying a moderate magnitude bias current, greater than the low magnitude bias current and less than the high magnitude bias current, for a third clock segment. The third clock segment can correspond with an amplification process involving amplification of a residue signal derived at least in part from the analog signal. At 810, method 800 can comprise receiving a digital output of the analog signal from the ADC at an end of the third clock segment. In at least one aspect, the digital output can be a 13 bit signal.

FIG. 9 illustrates a flowchart of a sample method 900 according to one or more additional aspects of the subject disclosure. At 902, method 900 can comprise receiving an analog input comprising optical information that is output from an image sensor. At 904, method 900 can comprise receiving a reference signal. The reference signal can be a ramp-down or ramp-up voltage, in one aspect of the subject disclosure, and in other aspects, the reference signal can be a step-voltage signal. At 906, method 900 can comprise monitoring respective magnitudes of the analog input and the reference signal. At 908, method 900 can comprise generating a high magnitude bias current for the monitoring. Additionally, at 910, method 900 can comprise generating a set of most significant bits for a digital output signal when magnitudes of the reference signal and the analog input are within a threshold range of equality.

At 912, method 900 can comprise tracking and storing the reference signal voltage. At 914, method 900 can comprise reducing the bias current to a low magnitude for the tracking and storing the reference signal voltage. At 916, method 900 can further comprise increasing the bias current to a moderate magnitude, greater than the low magnitude and less than the high magnitude. At 918, method 900 can comprise generating a residue signal derived from a difference in the analog signal and the reference signal. At 920, method 900 can comprise amplifying the residue signal and extracting a set of least significant bits for the digital output signal. At 922, method 900 can comprise combining and outputting the set of most significant bits and the set of least significant bits as the digital output signal. At 924, method 900 can comprise returning the bias current to the low magnitude at an end of a clock cycle.

Figure 10:
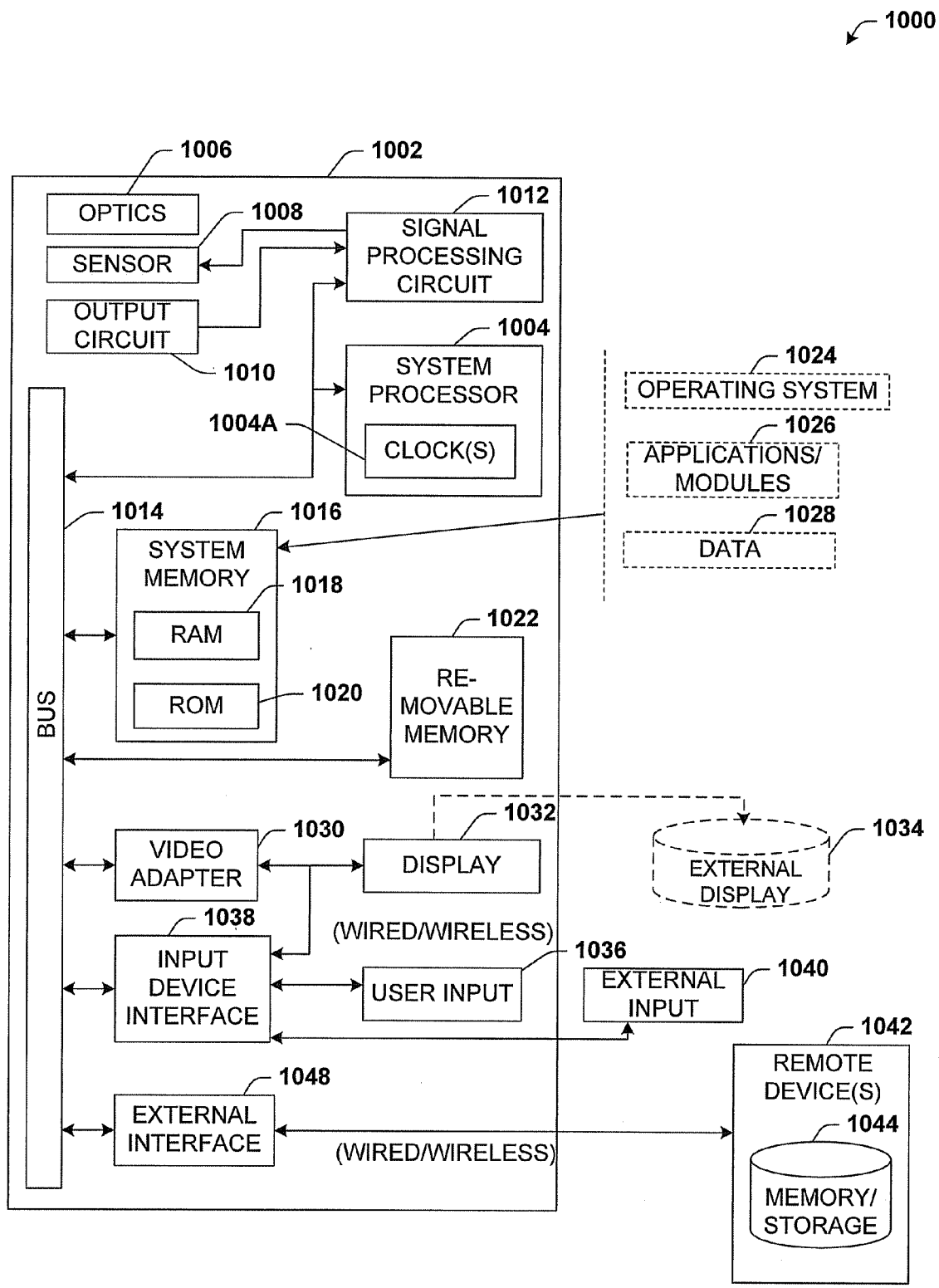
FIG. 10 illustrates a block diagram of a sample electronic device with a camera module that can be utilized on conjunction with disclosed aspects.

Referring now to FIG. 10, there is illustrated a block diagram of an exemplary digital camera system operable to execute the disclosed architecture. In order to provide additional context for various aspects of the various embodiments, FIG. 10 and the following discussion are intended to provide a brief, general description of a suitable electronic computing environment 1000 in which the various aspects of the various embodiments can be implemented. Additionally, while the various embodiments described above may be suitable for application in the general context of instructions that may run or be executed in conjunction with an electronic device, those skilled in the art will recognize that the various embodiments also can be implemented in combination with other program modules and/or as a combination of hardware and software.

Generally, program modules include routines, programs, components, data structures, etc., that perform particular tasks associated with electronic computing environment 1000. Moreover, those skilled in the art will appreciate that the inventive methods can be practiced with other electronic system configurations, including hand-held computing devices, microprocessor-based or programmable consumer electronics, single-processor or multiprocessor state machines, minicomputers, as well as personal computers, and the like, each of which can be operatively coupled to one or more associated devices.

The illustrated aspects of the various embodiments may also be practiced in distributed computing environments where certain tasks are performed by remote processing devices that are linked through a wired or wireless communications network. In a distributed computing environment, program modules can be located in both local and remote memory storage devices.

An electronic processing device typically includes a variety of computer-readable media. Computer-readable media can be any available media that can be accessed by the electronic processing device and includes both volatile and non-volatile media, removable and non-removable media. By way of example, and not limitation, computer-readable media can comprise computer storage media and communication media. Computer storage media can include both volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, or any other medium which can be used to store the desired information and which can be accessed by the electronic processing device.

Continuing to reference FIG. 10, the exemplary electronic processing environment 1000 for implementing various aspects of one or more of the various embodiments includes a digital camera 1002, the digital camera 1002 including a system processor 1004, optics 1006, an image sensor 1008, an output circuit 1010, a signal processing circuit 1012, a system memory 1016 and a system bus 1014. The system bus 1014 couples to system components including, but not limited to, the system memory 1016 to the system processor 1004. The system processor 1004 can be a suitable semiconductor processing device manufactured for digital camera 1002, or any of various commercially available processors. Dual microprocessors and other multi-processor architectures may also be employed as the system processor 1004.

Optics 1006 can comprise one or more lens elements comprised of refractive material. The refractive material can be suitable to refract electromagnetic radiation, particularly in the visible spectrum, but also the near infrared or ultraviolet spectra, or other suitable spectra. Particularly, optics 1006 can be configured to project and focus an image of an object onto image sensor 1008. Optics can also be configured with an actuator (not depicted) to mechanically adjust optics 1006 to focus objects at varying distances from digital camera 1002.

Image sensor 1008 can comprise any of various sensors for receiving electromagnetic radiation and generating electric signals proportionate to a magnitude of the electromagnetic radiation. For instance, image sensor 1008 can comprise a video tube, a charge-coupled device, or a CMOS device, or the like, or an array of such devices. In a particular example, image sensor 1008 can comprise an array of photodetectors as described herein (e.g., photodetector array 104). Electric signals generated by image sensor 1008 can be transferred to output circuit 1010, in response to a clock signal generated by an electronic clock(s) 1004A managed by system processor 1004. The electric signals can then be output to signal processing circuit 1012 for image processing.

Signal processing circuit 1012 can be any suitable hardware or software processing entity, including an integrated circuit(s), an application specific integrated circuit(s) (ASIC), a state machine, or other suitable signal processing device. Signal processing circuit 1012 can be configured to perform operations on electric signals provided by output circuit 1010. These operations can include correlated double sampling, gamma processing, analog to digital conversion, gain adjustment, interpolation, compression, or a combination thereof or of the like, to generate digital data to be adapted for presentation on an electronic display 1032 of digital camera 1002. Additionally, signal processing circuit 1012 can store the digital data in system memory 1016 before, during and after the operations.

The system bus 1014 can be any of several types of bus structure suitable for communicatively connecting components of digital camera 1002. System bus 1014 can further interconnect to a memory bus (with or without a memory controller), a peripheral bus, and a local bus using any of a variety of commercially available bus architectures. The system memory 1016 can include read-only memory (ROM) 1020 and random access memory (RAM) 1018. A basic input/output system (BIOS) for digital camera 1002 can be stored in a non-volatile memory 1020 such as ROM, EPROM, EEPROM, which BIOS contains the basic routines that help to transfer information between elements within the digital camera 1002, when powered on for instance. The RAM 1018 can also include a high-speed RAM such as static RAM for caching data. Furthermore, digital camera can include removable memory 1022, which can include any suitable non-volatile memory (e.g., Flash memory), or other removable memory technology.

A number of program modules can be stored in the system memory 1016, including an operating system 1024, one or more application programs or program modules 1026 and program data 1028. All or portions of the operating system, applications, modules, and/or data can also be cached in the RAM 1018 It is appreciated that the various embodiments can be implemented with various commercially available or proprietary operating systems or combinations of operating systems.

A display 1032 is also connected to the system bus 1014 via an interface, such as a video adapter 1030. Display 1032 can comprise a flat panel display, such as a liquid crystal display, a light-emitting diode display, or the like. System processor 1004 can control output of image data to present a digital replica of the image received by image sensor 1008 on display 1032. In addition, digital camera 1002 can output the image data to an external display 1034 via a suitable external interface 1048.

A user can enter commands and information into the digital camera 1002 through one or more input devices, e.g., touch screen buttons, switches, dials, levers, etc. For instance, zoom functionality is often implemented by pressing a button, dial, lever, etc., in one direction to zoom in, or another direction to zoom out. Further, display options, selection of images, and similar display commands can be input via a touch screen, often implemented as part of display 1032. Other input devices (not shown) may include a microphone, an IR remote control, a joystick, a game pad, a stylus pen, or the like. These and other input devices are often connected to the system processor 1004 through an input device interface 1038 that is coupled to the system bus 1014, but can be connected by other interfaces, such as a parallel port, an IEEE1394 serial port, a game port, a USB port, an IR interface, a Bluetooth interface, etc.

The external interface 1048 can include at least one or both of Universal Serial Bus (USB) and IEEE1394 interface technologies. Other external connection technologies are within contemplation of the subject matter claimed herein. Moreover, external interface 1048 can include a wireless technology, such as a Wi-Fi communication technology, Bluetooth™ technology, infrared (IR) technology, cellular technology, or the like. In addition to an external display, external interface 1048 can facilitate communicatively coupling digital camera 1002 to one or more remote devices 1042. Remote device(s) 1042 can include a computer, a display, a memory or storage device 1044, and so on. Moreover, commands can be given to digital camera 1002 from remote device(s) 1042 over external interface 1048 to system processor 1004. This can facilitate remote control of digital camera 1002, for remote camera operation (e.g., taking pictures, adding or deleting pictures from system memory 1016, etc.), transferring data, such as stored digital images, updating operation system 1024, applications/program modules 1026, or data 1028, and so on.

The digital camera 1002 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth wireless technologies. Thus, the communication can be a predefined structure as with a conventional network or simply an ad hoc communication between at least two devices.

Wi-Fi, or Wireless Fidelity, allows connection to the Internet from various locations within range of a Wi-Fi access point, without wires. Wi-Fi is a wireless technology similar to that used in a cell phone that enables such devices, e.g., computers, to send and receive data indoors and out; within the range of the access point. Wi-Fi networks use radio technologies called IEEE802.11 (a, b, g, n, etc.) to provide secure, reliable, fast wireless connectivity. A Wi-Fi network can be used to connect computers to each other, to the Internet, and to wired networks (which use IEEE802.3 or Ethernet). Wi-Fi networks operate in the unlicensed 2.4 and 5 GHz radio bands, at an 11 Mbps (802.11a) or 54 Mbps (802.11b) data rate, for example, as well as other rates (e.g., 802.11g, 802.11n, . . . ) or with products that contain both bands (dual band), so the networks can provide real-world performance similar to the basic 10BaseT wired Ethernet networks used in many offices.

What has been described above includes examples of the various embodiments. It is, of course, not possible to describe every conceivable combination of components or methods for purposes of describing the embodiments, but one of ordinary skill in the art may recognize that many further combinations and permutations are possible. Accordingly, the detailed description is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments includes a system as well as a computer-readable medium having computer-executable instructions for performing the acts and/or events of the various methods.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

What is claimed is:

1. A circuit comprising an analog to digital converter (ADC) that receives an analog input comprising optical information from an optical sensor, and that outputs the optical information as a digital output, comprising:
   a first stage circuit comprising at least a comparator and a counter, and configured to generate a set of most significant bits (MSBs) for the digital output from the analog input, and to output a residue signal derived from the analog input and a reference voltage;
   a second stage circuit comprising a sampling circuit that extracts a set of least significant bits for the digital output from the residue signal; and
   a power reduction circuit that reduces a current supplied to at least a subset of the first stage circuit following generation of the set of MSBs, the power reduction circuit comprising a bump bias generator that generates the current as a non-constant function of the analog input and the reference voltage.

2. An optical image sensor comprising the circuit of claim 1.

3. The circuit of claim 1, wherein the bump bias generator increases the current to a high magnitude, greater than the reduced current, for generation of the set of MSBs.

4. The circuit of claim 3, wherein the bump bias generator increases the current to a moderate magnitude, greater than the reduced current but less than the high magnitude, during amplification and output of the residue signal.

5. The circuit of claim 4, the bump bias generator decreases the current to the reduced current following amplification and output of the residue signal, and prior to increasing the current to the high magnitude for generation of the set of MSBs.

6. The circuit of claim 1, wherein the reference voltage comprises a linearly changing magnitude.

7. The circuit of claim 1, wherein the reference voltage changes in magnitude in a sequence of steps having respective discrete magnitudes.

8. The circuit of claim 1, wherein the ADC has an analog to digital conversion resolution of 10 or more bits.

9. The circuit of claim 8, wherein the analog to digital conversion resolution is 13 bits.

10. A circuit comprising an analog to digital converter (ADC) that receives an analog input comprising optical information from an optical sensor, and that outputs the optical information as a digital output, comprising:
    a first stage circuit comprising at least a comparator, a counter, and a track and hold and residue amplification circuit, and configured to generate a set of most significant bits (MSBs) for the digital output from the analog input, and to output a residue signal derived from the analog input and a reference voltage;
    a second stage circuit comprising a sampling circuit that extracts a set of least significant bits for the digital output from the residue signal; and
    a power reduction circuit that reduces a current supplied to at least a subset of the first stage circuit following generation of the set of MSBs,
    wherein the track and hold and residue amplification circuit comprises at least an operational transconductance amplifier (OTA) and a sampling capacitor, wherein:
    the OTA comprises a first signal input and a second signal input, and the sampling capacitor is connected to the second signal input;
    the reference voltage is provided to the first signal input during a first portion and a second portion of a clock cycle, wherein the sampling capacitor tracks the magnitude of the reference voltage;
    the analog input is provided to the first signal input at the start of a third portion of the clock cycle, wherein a value of the reference voltage is applied by the sampling capacitor to the second input; and
    the OTA amplifies a difference in the analog input at the first signal input and the reference voltage at the second signal input, and outputs the amplified difference as the residue signal.

11. The circuit of claim 10, wherein the comparator receives the analog input and the reference voltage as inputs, and triggers the counter in response to the analog input satisfying a condition with respect to the reference voltage.

12. The circuit of claim 11, wherein the condition comprises the analog input and the reference voltage having equal magnitudes within a threshold voltage.

13. The circuit of claim 10, wherein the counter generates the set of MSBs from the analog input in response to being triggered by the comparator.

14. The circuit of claim 10, wherein the track and hold and residue amplification circuit generates the residue signal by amplifying a difference in the analog input and the reference voltage in response to the counter being triggered by the comparator.

15. An optical image sensor comprising the circuit of claim 10.

16. A method for operating a column-parallel slope-based analog to digital converter (ADC) for converting analog optical information output by an optical sensor into digital optical information, comprising:
    providing an analog signal from the optical sensor and a reference signal as inputs to the ADC;
    increasing a bias current to the ADC for a portion of a clock cycle in which respective magnitudes of the analog input and the reference signal are within a predetermined range of equality and in which the ADC generates a set of most significant bits for the digital optical information; and
    decreasing the bias current to the ADC following the portion of the clock cycle at least for a subset of a remainder of the clock cycle.

17. The method of claim 16, wherein increasing the bias current for the portion of the clock cycle further comprises increasing the bias current to a highest magnitude for the portion of the clock signal.

18. The method of claim 17, wherein decreasing the bias current following the portion of the clock cycle further comprises decreasing the bias current to a lowest magnitude, less than the highest magnitude.

19. The method of claim 18, further comprising increasing the bias current to a moderate magnitude, greater than the lowest magnitude and less than the highest magnitude, during a second portion of the clock cycle in which a residue of the analog input and the reference signal are amplified to generate a set of least significant bits for the digital optical information.

20. An optical sensor, comprising:
    a column-parallel array of photodetectors;
    a signal bus for transferring analog information from a subset of the array of photodetectors to an analog to digital converter (ADC) configured to convert the analog information to digital information, the ADC comprising:

a comparator and a counter configured to generate a set of most significant bits (MSBs) of the digital information from the analog information, and to output a residue signal derived from the analog information and a reference voltage;

a sampling circuit that extracts a set of least significant bits of the digital information from the residue signal; and a power reduction circuit that increases a bias current to the ADC during generation of the set of MSBs, and decreases the bias current to the ADC after generation of the set of MSBs, a magnitude of the bias current is determined from input and reference signal magnitudes.

* * * * *